United States Patent
Hirano et al.

(10) Patent No.: US 9,012,122 B2
(45) Date of Patent: Apr. 21, 2015

(54) MODIFIED NOVOLAK PHENOLIC RESIN, MAKING METHOD, AND RESIST COMPOSITION

(71) Applicant: Shin-Etsu Chemical Co., Ltd., Tokyo (JP)

(72) Inventors: Yoshinori Hirano, Annaka (JP); Hideyoshi Yanagisawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 24 days.

(21) Appl. No.: 13/658,844

(22) Filed: Oct. 24, 2012

(65) Prior Publication Data

US 2013/0101937 A1    Apr. 25, 2013

(30) Foreign Application Priority Data

Oct. 25, 2011 (JP) .................................. 2011-233901
Aug. 9, 2012 (JP) .................................. 2012-176987

(51) Int. Cl.
*G03F 7/023* (2006.01)
*C08G 8/28* (2006.01)
*C08G 14/12* (2006.01)
*C08G 8/00* (2006.01)
*C08L 61/00* (2006.01)
*C08L 61/04* (2006.01)
*C08L 61/20* (2006.01)

(52) U.S. Cl.
CPC .. *C08G 8/00* (2013.01); *C08G 8/28* (2013.01); *C08G 14/12* (2013.01); *C08L 61/00* (2013.01); *C08L 61/04* (2013.01); *C08L 61/20* (2013.01); *G03F 7/023* (2013.01); *G03F 7/0236* (2013.01)

(58) Field of Classification Search
CPC ......... G03F 7/0236; C08G 8/28; C08G 14/12
USPC .......... 430/191, 192, 193; 525/504, 375, 507; 528/163
See application file for complete search history.

(56) References Cited

U.S. PATENT DOCUMENTS

| | | | | |
|---|---|---|---|---|
| 4,115,366 | A | * | 9/1978 | Kellner .......................... 525/497 |
| 4,454,298 | A | * | 6/1984 | Koyama et al. ................ 528/137 |
| 5,629,083 | A | * | 5/1997 | Teodorczyk ................ 428/308.8 |
| 5,639,587 | A | * | 6/1997 | Sato et al. ....................... 430/190 |
| 5,876,895 | A | | 3/1999 | Hishiro et al. |
| 5,952,447 | A | * | 9/1999 | Ikeda ............................. 528/163 |
| 5,985,507 | A | * | 11/1999 | Blakeney et al. ............. 430/190 |
| 7,214,454 | B2 | * | 5/2007 | Inomata et al. .................. 430/18 |
| 2004/0094752 | A1 | | 5/2004 | Ito et al. |
| 2004/0126696 | A1 | | 7/2004 | Inomata et al. |

FOREIGN PATENT DOCUMENTS

| | | |
|---|---|---|
| EP | 1 755 365 A1 | 2/2007 |
| EP | 2 395 395 A2 | 12/2011 |
| EP | 2 395 395 A3 | 8/2012 |
| JP | 3-243613 A | 10/1991 |
| JP | 2000-309617 A | 11/2000 |
| JP | 2001-249449 A | 9/2001 |
| JP | 2004-14297 A | 1/2004 |
| JP | 2004-292791 A | 10/2004 |
| JP | 2005-306987 A | 11/2005 |
| JP | 2006-201653 A | 8/2006 |
| JP | 2010-85567 A | 4/2010 |
| WO | WO 99/42507 A1 | 8/1999 |

OTHER PUBLICATIONS

Extended European Search Report for Appl. No. 12189273.1 dated Aug. 19, 2013.

* cited by examiner

*Primary Examiner* — John Chu
(74) *Attorney, Agent, or Firm* — Birch, Stewart, Kolasch & Birch, LLP

(57) ABSTRACT

A modified novolak phenolic resin is obtained by reacting a novolak phenolic resin containing at least 50 wt % of p-cresol with a crosslinker. This method increases the molecular weight of the existing novolak phenolic resin containing at least 50 wt % of p-cresol to such a level that the resulting modified novolak phenolic resin has heat resistance enough for the photoresist application.

8 Claims, No Drawings

MODIFIED NOVOLAK PHENOLIC RESIN, MAKING METHOD, AND RESIST COMPOSITION

CROSS-REFERENCE TO RELATED APPLICATION

This non-provisional application claims priority under 35 U.S.C. §119(a) on Patent Application Nos. 2011-233901 and 2012-176987 filed in Japan on Oct. 25, 2011 and Aug. 9, 2012, respectively, the entire contents of which are hereby incorporated by reference.

TECHNICAL FIELD

This invention relates to a modified novolak phenolic resin obtained by reacting a novolak phenolic resin resulting from a phenol containing at least 50% by weight of p-cresol with a crosslinker, a method of preparing the resin, and a resist composition comprising the resin.

BACKGROUND ART

Novolak phenolic resins are thermoplastic resins. Various means are known for increasing the weight average molecular weight of novolak phenolic resins. For example, JP-A 2005-306987 describes a two-stage reaction method designed to increase the weight average molecular weight while reducing phenol dimer. JP-A 2004-292791 discloses a method of preparing triazine-modified novolak phenolic resin designed to increase the weight average molecular weight while reducing unreacted phenol. These methods are not regarded versatile since they are limitative in that polymerization in the presence of phosphoric acid is essential in the first stage of synthesizing novolak phenolic resin. In addition, the second stage of reaction needs pH control and addition of aldehyde for the purpose of reducing the phenol dimer or unreacted phenol. The methods are more limitative in this sense too. They are not regarded as simple means for increasing the molecular weight of novolak phenolic resins. Also JP-A 2000-309617 discloses a condensates of phenol derivative, aldehyde and triazine derivative as a phenol-amino condensation resin. This method is also limitative in that polymerization is carried out while restricting a molar ratio of a methylol group content to a methylene bond content in a certain range and effecting reaction in the co-presence of a triazine derivative and aldehyde. This is not regarded simple or brief in increasing the molecular weight of novolak phenolic resins.

On the other hand, resol phenolic resins are thermosetting resins. JP-A H03-243613 discloses a method of preparing a phenol-melamine co-condensation resin. However, this method is applicable to the novolak phenolic resins with difficulty because the synthesis of a phenolic resin as the starting resin is different between the novolak type and the resol type.

CITATION LIST

Patent Document 1: JP-A 2005-306987
Patent Document 2: JP-A 2004-292791
Patent Document 3: JP-A 2000-309617
Patent Document 4: JP-A H03-243613

SUMMARY OF INVENTION

An object of the invention is to provide a modified novolak phenolic resin. That is, a novolak phenolic resin polymerized by a well-known procedure using a phenol containing at least 50% by weight of p-cresol is simply and briefly modified through versatile means into a modified novolak phenolic resin having a higher molecular weight and heat resistance enough for use as photoresist material. Another object is to provide a method of preparing the modified novolak phenolic resin, and a resist composition using the modified novolak phenolic resin.

The inventors have found that when a novolak phenolic resin obtained using a phenol containing at least 50% by weight of p-cresol is modified by reacting it with a crosslinker in the presence of an acidic catalyst, the modified novolak phenolic resin exhibits sufficient thermal properties and is useful as the phenolic resin for photoresist use.

Seeking for the means for converting a novolak phenolic resin obtained using a phenol containing at least 50% by weight of p-cresol to a higher molecular weight resin, the inventors have arrived at the reaction of the novolak phenolic resin with a crosslinker in the presence of an acidic catalyst, and have found that the resultant modified novolak phenolic resin exhibits significant properties.

In one aspect, the invention provides a modified novolak phenolic resin obtained by reacting (A) a novolak phenolic resin obtained from condensation of a phenol containing at least 50% by weight of p-cresol and an aldehyde, or (B) a mixture of (b-1) at least 50% by weight of a p-cresol novolak resin obtained from condensation of p-cresol and an aldehyde and (b-2) the balance of another novolak phenolic resin obtained from condensation of a phenol other than p-cresol and an aldehyde with a crosslinker.

In a preferred embodiment, the phenol from which the novolak phenolic resin (A) is obtained consists of 50 to 80% by weight of p-cresol and the balance of another phenol.

In a preferred embodiment, the mixture (B) consists of 50 to 80% by weight of the p-cresol novolak resin (b-1) and the balance of the other novolak phenolic resin (b-2).

In a preferred embodiment, the novolak phenolic resin (A), the p-cresol novolak resin (b-1), and the other novolak phenolic resin (b-2) each have a weight average molecular weight in the range of 1,500 to 10,000.

In a preferred embodiment, the crosslinker is at least one member selected from the group consisting of an amino condensate modified with formalin or formalin-alcohol, a phenol compound having on average at least two methylol or alkoxymethylol groups in a molecule, and an epoxy compound having on average at least two epoxy groups in a molecule. Typically, the crosslinker is a modified melamine condensate or modified urea condensate.

In another aspect, the invention provides a method of preparing a modified novolak phenolic resin, comprising the steps of mixing (A) a novolak phenolic resin obtained from condensation of a phenol containing at least 50% by weight of p-cresol and an aldehyde, or (B) a mixture of (b-1) at least 50% by weight of a p-cresol novolak resin obtained from condensation of p-cresol and an aldehyde and (b-2) the balance of another novolak phenolic resin obtained from condensation of a phenol other than p-cresol and an aldehyde with a crosslinker, simultaneously or subsequently adding an acidic catalyst thereto, and effecting reaction.

In a preferred embodiment, the phenol from which the novolak phenolic resin (A) is obtained consists of 50 to 80% by weight of p-cresol and the balance of another phenol.

In a preferred embodiment, the mixture (B) consists of 50 to 80% by weight of the p-cresol novolak resin (b-1) and the balance of the other novolak phenolic resin (b-2).

In a preferred embodiment, the novolak phenolic resin (A), the p-cresol novolak resin (b-1), and the other novolak phenolic resin (b-2) each have a weight average molecular weight in the range of 1,500 to 10,000.

In a preferred embodiment, the crosslinker is at least one member selected from the group consisting of an amino condensate modified with formalin or formalin-alcohol, a phenol compound having on average at least two methylol or alkoxymethylol groups in a molecule, and an epoxy compound having on average at least two epoxy groups in a molecule. Typically, the crosslinker is a modified melamine condensate or modified urea condensate.

In a preferred embodiment, the acidic catalyst is at least one acid selected from the group consisting of hydrochloric acid, sulfuric acid, boric acid, oxalic acid, acetic acid, benzenesulfonic acid, p-toluenesulfonic acid, xylenesulfonic acid, p-phenolsulfonic acid, methanesulfonic acid, and ethanesulfonic acid. Typically, the acidic catalyst is an organic sulfonic acid.

In a preferred embodiment, the steps of simultaneously or subsequently adding an acidic catalyst and effecting reaction include holding at a temperature of at least 10° C.

In a further aspect, the invention provides a resist composition comprising the modified novolak phenolic resin defined above as a base resin. Typically, the resist composition is a positive working composition. The resist composition may further comprise a 1,2-naphthoquinonediazidosulfonic acid ester. Preferably, the 1,2-naphthoquinonediazidosulfonic acid ester is an ester of some or all modified phenolic hydroxyl groups on the modified novolak phenolic resin defined above with 1,2-naphthoquinonediazidosulfonic acid.

Advantageous Effects of Invention

The invention makes it easy to increase the molecular weight of an existing novolak phenolic resin obtained using a phenol containing at least 50% by weight of p-cresol. The resulting modified novolak phenolic resin has sufficient heat resistance for use in the photoresist application.

DESCRIPTION OF PREFERRED EMBODIMENTS

The modified novolak phenolic resin (I) of the invention is obtained from a starting novolak phenolic resin (II) which may be either (A) a novolak phenolic resin obtained from condensation of a phenol containing at least 50% by weight of p-cresol and an aldehyde, or (B) a mixture of (b-1) at least 50% by weight of a p-cresol novolak resin obtained from condensation of p-cresol and an aldehyde and (b-2) the balance of another novolak phenolic resin obtained from condensation of a phenol other than p-cresol and an aldehyde. The novolak phenolic resin (A) may be a copolymer. The p-cresol novolak resin (b-1) is a polymer. The other novolak phenolic resin (b-2) may be a polymer, and is also referred to as p-cresol-free resin. These novolak phenolic resins may be prepared by any well-known methods, specifically by using a phenol(s) and an aldehyde(s) as reactants, and reacting them in the presence of a well-known acidic catalyst, optionally in a reaction-mediating solvent.

In the novolak phenolic resin (A), p-cresol is essential as the phenol reactant and optionally, substituted or unsubstituted phenols may be used as the phenol reactant other than p-cresol. Suitable phenols which can be used herein include m-cresol, o-cresol, phenol, 2-allylphenol; xylenols such as 2,3-xylenol, 2,5-xylenol, 3,5-xylenol, and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and 6-tert-butyl-3-methylphenol; alkoxyphenols such as p-methoxyphenol, m-methoxyphenol, p-ethoxyphenol, m-ethoxyphenol, p-propoxyphenol, and m-propoxyphenol; isopropenylphenols such as o-isopropenylphenol, p-isopropenylphenol, 2-methyl-4-isopropenylphenol, and 2-ethyl-4-isopropenylphenol; polyhydroxyphenols such as 4,4'-dihydroxybiphenyl, bisphenol A, phenylphenol, resorcinol, hydroquinone, pyrogallol; α-naphthol, β-naphthol, dihydroxynaphthalene, and derivatives thereof.

The novolak phenolic resin is prepared using at least 50% by weight of p-cresol as the phenol reactant. Although the novolak phenolic resin may be a homopolymer using 100% by weight of p-cresol, that is, p-cresol novolak phenolic resin, the novolak phenolic resin is preferably a copolymer prepared using 50 to 80% by weight, especially 55 to 70% by weight of p-cresol and the balance of another phenol as the phenol reactant because the copolymer resin has a higher average molecular weight.

Instead of the copolymer resin mentioned above, it is acceptable to use a mixture of at least 50% by weight, preferably 50 to 80% by weight, and more preferably 55 to 70% by weight of a p-cresol homopolymer resin (i.e., p-cresol novolak resin) and the balance of another novolak phenolic resin which is a polymer using a phenol other than p-cresol or a copolymer using two or more phenols other than p-cresol.

Suitable other phenols are as illustrated above. Inter alia, m-cresol, o-cresol, phenol, 2-allylphenol, 2,3-xylenol, 2,5-xylenol, 3,5-xylenol, and 3,4-xylenol are suitable.

It is not recommended to use a novolak phenolic resin using p-cresol in an amount of less than 50% by weight of the entire phenol reactant, and a mixture containing less than 50% by weight of the p-cresol novolak resin. This is because a resist film formed therefrom experiences a substantial thickness change before and after development, which will give rise to problems in the subsequent steps such as etching and electrolytic plating.

The other reactant from which the novolak phenolic resin is prepared is an aldehyde. Any well-known aldehydes may be used. Suitable aldehydes include formaldehyde, paraformaldehyde, chloroacetaldehyde, dichloroacetaldehyde, bromoacetaldehyde, trioxane, benzaldehyde, acetaldehyde, p-nitrobenzaldehyde, p-acetoxybenzaldehyde, p-acetylaminobenzaldehyde, hydroxybenzaldehyde, dihydroxybenzaldehyde, vanillin, ethylvanillin, glyoxal, acrolein, and methacrolein. Inter alia, formaldehyde, hydroxybenzaldehyde, and chloroacetaldehyde are preferred.

The molecular weight of the novolak phenolic resin (A) obtained from condensation of a phenol containing at least 50% by weight of p-cresol and an aldehyde, the p-cresol novolak resin (b-1) obtained from condensation of p-cresol and an aldehyde, and the other novolak phenolic resin (b-2) obtained from condensation of a phenol other than p-cresol and an aldehyde is not particularly limited. These resins preferably have a weight average molecular weight (Mw) of at least 1,500, more preferably at least 3,000, even more preferably at least 5,000 as measured by gel permeation chromatography (GPC) versus polystyrene standards, for effective conversion to a higher molecular weight. Although the upper limit of Mw is not critical, the Mw is preferably up to 30,000, more preferably up to 20,000.

According to the invention, the modified novolak phenolic resin (I) is obtained by reacting the novolak phenolic resin (II) which is the novolak phenolic resin (A) or mixture (B) with a crosslinker (III).

Suitable crosslinkers include an amino condensate modified with formalin or formalin-alcohol, a phenol compound having on average at least two methylol or alkoxymethylol groups in a molecule, and an epoxy compound having on average at least two epoxy groups in a molecule, which may be used alone or in admixture of two or more.

Examples of the amino condensate modified with formalin or formalin-alcohol include melamine condensates modified with formalin or formalin-alcohol, and urea condensates modified with formalin or formalin-alcohol.

The melamine condensate modified with formalin or formalin-alcohol is prepared, for example, by modifying a melamine monomer with formalin in a standard way into a methylol form, and optionally further modifying it with alcohol into an alkoxy form. There is obtained a modified melamine having the general formula (1). The alcohol used herein is preferably selected from lower alcohols, for example, alcohols of 1 to 4 carbon atoms.

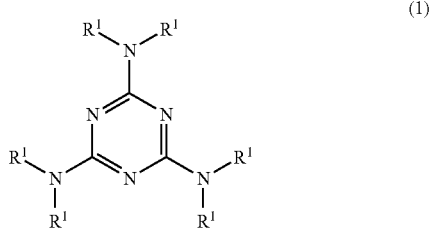

(1)

Herein $R^1$ may be the same or different and is a methylol group, an alkoxymethyl group having alkoxy moiety of 1 to 4 carbon atoms, or hydrogen, with the proviso that at least one $R^1$ is a methylol or alkoxymethyl group.

Examples of $R^1$ include a methylol group, alkoxymethyl groups such as methoxymethyl and ethoxmethyl, and hydrogen.

Examples of the modified melamine having formula (1) include trimethoxymethylmonomethylolmelamine, dimethoxymethylmonomethylolmelamine, trimethylolmelamine, hexamethylolmelamine, and hexamethoxymethylolmelamine.

Then the modified melamine having formula (1) or an oligomer thereof (such as dimer or trimer) is subjected to addition condensation polymerization with formaldehyde in a standard way until the desired molecular weight is reached. There is obtained a melamine condensate modified with formalin or formalin-alcohol.

The urea condensate modified with formalin or formalin-alcohol is prepared, for example, by modifying a urea condensate having a preselected molecular weight with formalin in a standard way into a methylol form, and optionally further modifying it with alcohol into an alkoxy form.

Examples of the urea condensate modified with formalin or formalin-alcohol include methoxymethylated urea condensates, ethoxymethylated urea condensates, and propoxymethylated urea condensates.

The modified melamine condensates and the modified urea condensate may be used alone or in admixture of two or more.

Suitable phenol compounds having on average at least two methylol or alkoxymethylol groups in a molecule include (2-hydroxy-5-methyl)-1,3-benzenedimethanol and 2,2',6,6'-tetramethoxymethylbisphenol A. These phenol compounds may be used alone or in admixture of two or more as the crosslinker.

Suitable epoxy compounds having on average at least two epoxy groups in a molecule include bisphenol epoxy resins such as bisphenol A epoxy resins and bisphenol F epoxy resins, novolak epoxy resins such as phenol novolak epoxy resins and cresol novolak epoxy resins, triphenolalkane epoxy resins and polymers thereof, biphenyl epoxy resins, dicyclopentadiene-modified phenol novolak epoxy resins, phenolaralkyl epoxy resins, biphenylaralkyl epoxy resins, naphthalene ring-containing epoxy resins, glycidyl ester epoxy resins, alicyclic epoxy resins, and heterocyclic epoxy resins.

Of the foregoing crosslinkers, the modified melamine condensates and modified urea condensates are preferred for ease of reaction control.

The crosslinker (III) may be used alone or in admixture of two or more. The crosslinker (III) is preferably used in an amount of 0.1 to 50 parts, more preferably 0.5 to 30 parts by weight per 100 parts by weight of the novolak phenolic resin (II). Less than 0.1 pbw of the crosslinker may fail to achieve the object of the invention whereas more than 50 pbw of the crosslinker may excessively promote the resin reaction, resulting in gelation.

In a preferred embodiment, the reaction of novolak phenolic resin (II) with crosslinker (III) in the presence of an acidic catalyst is carried out in an organic solvent. Suitable organic solvents which can be used herein include alcohols, glycols, ketones, ethers, lactones, and aromatics. Examples include alcohols such as methanol, ethanol, and propanol; diols such as 1,3-butanediol, ethylene glycol, propylene glycol, and diethylene glycol; ketones such as dimethyl ketone, methyl ethyl ketone, diethyl ketone, and methyl isobutyl ketone; ethers such as 1,4-dioxane, tetrahydrofuran, cyclopentyl methyl ether, ethylene glycol monomethyl ether, and ethylene glycol monoethyl ether; lactones such as γ-butyrolactone; and aromatic hydrocarbons such as toluene and xylene. The solvent is not limited to the foregoing examples as long as the novolak phenolic resin containing at least 50% by weight of p-cresol and the crosslinker are uniformly dissolved therein.

The organic solvent may be used alone or in admixture of two or more. The amount of the organic solvent used is not particularly limited as long as the novolak phenolic resin (II) and the crosslinker (III) are uniformly dissolved therein. Specifically, the solvent is used in an amount of 0.5 to 100 times greater, preferably 0.8 to 50 times greater, more preferably 1.0 to 10 times greater than 100 parts by weight of novolak phenolic resin (II).

Suitable acidic catalysts include mineral acids such as hydrochloric acid, sulfuric acid and boric acid; and organic acids such as oxalic acid, acetic acid, benzenesulfonic acid, p-toluenesulfonic acid, xylenesulfonic acid, p-phenolsulfonic acid, methanesulfonic acid, and ethanesulfonic acid, which may be used alone or in admixture of two or more. Preferably organic sulfonic acids are used because of high solubility in organic solvents and strong acidity.

The acidic catalyst is preferably used in an amount of 0.1 to 70 parts, more preferably 0.5 to 50 parts, and even more preferably 1.0 to 30 parts by weight per 100 parts by weight of the novolak phenolic resin (II). The acidic catalyst may be initially dissolved in the organic solvent at the same time as novolak phenolic resin (II) and crosslinker (III), or later added dropwise to a solution of novolak phenolic resin (II) and crosslinker (III) in the organic solvent. Preferably the addition of the crosslinker is followed by the addition of the acidic catalyst.

Independent of whether the acidic catalyst is initially mixed with novolak phenolic resin (II) and crosslinker (III) or later added thereto, the temperature of the solution during reaction is preferably at least 10° C. If the acidic catalyst is added at a lower temperature, the reaction may be retarded. As the reaction temperature is higher, the reaction time becomes shorter. At an extremely high temperature, however, the reaction may become difficult to control. The reaction is preferably performed at a temperature of up to 100° C., more preferably 10 to 80° C., though not essential.

At the end of reaction, a basic substance such as pyridine or triethylamine is preferably added to control pH and quench the reaction, ensuring that the residual or unchanged acidic catalyst is deactivated. If base neutralization is difficult or inadequate, the acidic catalyst may be removed from the reaction solution by repeating several times the steps of adding deionized water to the reaction solution, stirring, stationary holding for layer separation, and removing the water layer out of the system. In the latter case, a basic substance such as pyridine may be dissolved in deionized water whereby neutralization and water washing are simultaneously performed. If it is unnecessary to quench the reaction completely, this catalyst removal step may be omitted. Further, if necessary, solvent exchange may be carried out, or the solvent may be removed by evaporation to dryness.

Through the foregoing steps, there is obtained a modified novolak phenolic resin (I) in which the hydrogen atom of some phenolic hydroxyl groups on novolak phenolic resin (II) is replaced by crosslinker (III).

The crosslinked/modified resin (I) has a higher molecular weight, specifically a weight average molecular weight (Mw) of at least 2,000, preferably at least 4,000, and more preferably at least 6,000 and up to 30,000, as measured by GPC versus polystyrene standards. The increase of molecular weight is not particularly limited as long as it is positive. Preferably the molecular weight of the modified resin (I) is at least 500, more preferably at least 1,500 higher than the molecular weight of the starting novolak phenolic resin (II). The upper limit of the molecular weight increase is not particularly limited although the molecular weight increase is typically up to 20,000.

The modified novolak phenolic resin (I) thus obtained may be formulated as a resist composition by combining with well-known photosensitive agents, photoacid generators, basic compounds, crosslinkers, dissolution accelerators, dissolution inhibitors, dyes, surfactants, and the like.

The modified novolak phenolic resin (I) may be used as a negative working resist composition. In this case, a resist solution may be prepared by dissolving 100 parts by weight of the modified novolak phenolic resin (I), 0.05 to 50 parts by weight of a photoacid generator, and 1 to 50 parts by weight of a crosslinker in a resist solvent, and optionally adding any well-known additives such as basic compound, surfactant, dye and dissolution accelerator. The resulting solution may be used as a negative resist solution directly or as a negative resist film after coating the resist solution and drying the coating to form a uniform film.

The modified novolak phenolic resin (I) may also be used as a positive working resist composition. The positive resist composition is preferred and may include the following embodiments.

(1) One embodiment is a composition comprising the modified novolak phenolic resin (I), a phenol compound in which some or all phenolic hydroxyl groups are substituted with 1,2-naphthoquinonediazidosulfonic acid, and optionally, an unmodified novolak phenolic resin or an unmodified novolak phenolic resin in which some or all phenolic hydroxyl groups are substituted with 1,2-naphthoquinonediazidosulfonic acid.

(2) Another embodiment is a composition comprising the modified novolak phenolic resin (I) in which the hydrogen atom of some or all phenolic hydroxyl groups is substituted by a 1,2-naphthoquinonediazidosulfonyl group, and optionally, a phenol compound in which some or all phenolic hydroxyl groups are substituted with 1,2-naphthoquinonediazidosulfonic acid and/or an unmodified novolak phenolic resin and an unmodified novolak phenolic resin in which some or all phenolic hydroxyl groups are substituted with 1,2-naphthoquinonediazidosulfonyl groups.

A resist solution may be prepared by optionally adding any well-known additives such as surfactant, photoacid generator, dye, crosslinker and dissolution accelerator to composition (1) or (2), and dissolving them in any well-known organic solvent. The resulting solution may be used as a positive resist solution directly or as a positive resist film after coating the resist solution and drying the coating to form a uniform film.

In either of the compositions, the naphthoquinonediazidosulfonic acid compound may be used in an amount of 0.1 to 40%, preferably 0.5 to 30% by weight of the modified novolak phenolic resin.

When the naphthoquinonediazidosulfonic acid compound is incorporated into the novolak phenolic resin, 0.1 to 40 parts by weight of a naphthoquinonediazidosulfonic acid halide, typically naphthoquinonediazidosulfonic acid chloride is added to 100 parts by weight of the novolak phenolic resin. Substitution is effected in the presence of a base such as triethylamine at a temperature in the range of 5 to 60° C., whereby the acid is incorporated into the resin.

(3) A further embodiment relates to the modified novolak phenolic resin in which some phenolic hydroxyl groups are substituted with well-known acid labile groups. For example, phenolic hydroxyl groups are reacted with a halogenated alkyl ether compound in the presence of a base, thereby yielding a modified novolak phenolic resin in which phenolic hydroxyl groups are partially protected with alkoxyalkyl groups (i.e., the hydrogen atom of phenolic hydroxyl groups is substituted by an alkoxyalkyl group). The reaction solvent is preferably selected from aprotic polar solvents such as acetonitrile, acetone, dimethylformamide, dimethylacetamide, tetrahydrofuran, and dimethyl sulfoxide, which may be used alone or in admixture. Suitable bases include triethylamine, pyridine, diisopropylamine, and potassium carbonate. The base is preferably used in an amount of at least 10 mol % based on the overall molar amount of phenolic hydroxyl groups. The reaction temperature is −50° C. to 100° C., preferably 0° C. to 60° C., and the reaction time is 0.5 to 100 hours, preferably 1 to 20 hours.

The mode of introduction of an acid labile group is not limited to the above embodiment. Any of well-known modes of introducing an acid labile group into a phenolic hydroxyl group may be used.

The thus obtained modified novolak phenolic resin having an acid labile group partially introduced therein is dissolved in an organic solvent along with a photoacid generator, obtaining a positive resist solution. If necessary, any of well-known additives such as basic compound, surfactant, dye, crosslinker, dissolution accelerator and dissolution inhibitor may be added. The resulting solution may be used as a positive resist solution directly or as a positive resist film after coating the resist solution and drying the coating to form a uniform film. In forming a resist film, a support film is typically used. The support film may be a single film or a multilayer film consisting of a plurality of laminated polymer layers. The support film may be made of synthetic resins such as polyethylene, polypropylene, polycarbonate, and polyethylene terephthalate. Inter alia, polyethylene terephthalate is preferred for appropriate flexibility, mechanical strength and heat resistance. The film may be pre-treated such as by corona treatment or coating of parting agent.

Using the positive resist composition, a resist pattern may be formed by any standard methods. The resist composition is applied onto a substrate in a suitable coating weight by a suitable coating technique. The substrate is selected from substrates of Si, SiO$_2$, SiN, SiON, TiN, WSi, BPSG, and SOG, metal substrates of Au, Ti, W, Cu, Ni—Fe, Ta, Zn, Co, and Pb, and organic antireflective coatings. Coating techniques include spin coating, roll coating, flow coating, dip coating, spray coating, and doctor coating. The coating is pre-baked on a hot plate at 60 to 150° C. for 1 to 10 minutes, preferably at 80 to 120° C. for 1 to 5 minutes to form a resist film of desired thickness. The resist film is exposed through a mask having a desired pattern to radiation such as UV, deep-UV or electron beam, preferably radiation having a wavelength of 200 to 500 nm. Exposure is preferably made in a dose of 1 to 1,000 mJ/cm$^2$, more preferably 10 to 800 mJ/cm$^2$. The resist film is post-exposure baked (PEB) at 60 to 150° C. for 1 to 5 minutes, preferably at 80 to 120° C. for 1 to 3 minutes.

Then the resist film is developed in a developer in the form of aqueous alkaline solution, typically of tetramethylammonium hydroxide (TMAH), for 0.1 to 60 minutes, preferably 0.5 to 10 minutes, by a standard technique such as dip, puddle or spray development. The desired pattern is formed on the substrate. Finally, a metal film is formed on the pattern by a suitable metallization technique such as sputtering or evaporation. The resist pattern is stripped together with the metal film lying thereon, leaving a metal wiring on the substrate.

EXAMPLE

Examples of the invention are given below by way of illustration and not by way of limitation. Mw is a weight average molecular weight as measured by gel permeation chromatography (GPC) versus polystyrene standards. Tg is glass transition temperature.

Example 1

To a solution of 300 g of a cresol novolak type phenolic resin having a Mw of 7,000 (Tg 105° C., using a phenol reactant consisting of 55 wt % of p-cresol and 45 wt % of m-cresol and an aldehyde reactant of formaldehyde) and 3.0 g of a crosslinker CL-1 having formula (2) (Nikalac® MW-390, Sanwa Chemical Co., Ltd.) in 600 g of cyclopentyl methyl ether, a solution of 6.0 g of p-toluenesulfonic acid in 60 g of cyclopentyl methyl ether was added dropwise at room temperature over 10 minutes. The solution was stirred at 25° C. for a further 2 hours (maturing). The resulting solution was analyzed by GPC, finding a modified resin having a Mw of 8,200.

CL-1

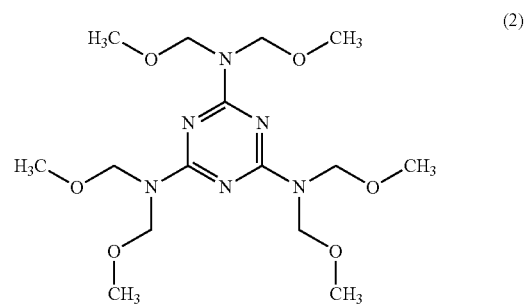

(2)

Examples 2 to 9

The reaction of novolak phenolic resin with crosslinker was carried out as in Example 1 aside from using the components shown in Table 1. There were obtained modified resins with Mw shown in Table 1.

TABLE 1

| | Example | | | | | | | |
|---|---|---|---|---|---|---|---|---|
| | 2 | 3 | 4 | 5 | 6 | 7 | 8 | 9 |
| Novolak phenolic resin | Mw: 3,000 (100 g) | Mw: 7,000 (100 g) | Mw: 3,000 (100 g) | Mw: 7,000 (100 g) | Mw: 7,000 (100 g) | Mw: 7,000 (100 g) | Mw: 7,000 (100 g) | Mw: 3,000 (100 g) |
| Organic solvent | acetone (150 g) | tetrahydrofuran (500 g) | tetrahydrofuran (300 g) | propylene glycol (500 g) | cyclopentyl methyl ether (500 g) | tetrahydrofuran (500 g) | tetrahydrofuran (500 g) | cyclopentyl methyl ether (150 g) |
| Crosslinker | Nikalac MX-270 (10 g) | Nikalac MW-390 (10 g) | Nikalac MX-270 (30 g) | Nikalac MW-390 (15 g) | EXA-850 CRP (10 g) | Nikalac MW-390 (10 g) | Nikalac MW-390 (10 g) | Nikalac MW-390 (10 g) |
| Acidic catalyst | oxalic acid (10 g) | trifluoromethanesulfonic acid (5 g) | p-toluenesulfonic acid (40 g) | hydrochloric acid (5 g) | methanesulfonic acid (3 g) | trifluoromethanesulfonic acid (2 g) | trifluoromethanesulfonic acid (8 g) | p-toluenesulfonic acid (10 g) |
| Reaction conditions | 25° C./ 2 hr maturing | 25° C./ 4 hr maturing | 60° C./ 4 hr maturing during and after dropwise addition | 25° C./ 4 hr maturing | 25° C./ 0.5 hr maturing | 25° C./ 4 hr maturing | 25° C./ 4 hr maturing | 3° C./ 2 hr maturing after dropwise addition |
| Final Mw | 3,600 | 8,600 | 3,800 | 7,800 | 10,500 | 7,600 | 9,800 | 3,300 |

*In Example 9, low temperature (3° C.) maturing was followed by quenching with triethylamine.

The novolak phenolic resin with Mw 7,000 was the same as in Example 1. The novolak phenolic resin with Mw 3,000 was a resin (Tg 90° C.) using a phenol reactant consisting of 60 wt % of p-cresol, 35 wt % of m-cresol and 5 wt % of 2,5-xylenol, and the same aldehyde reactant as above.

Nikalac MX-270: methylated urea resin

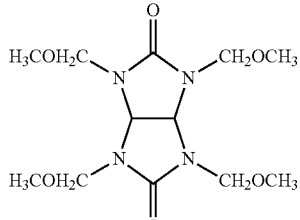

Nikalac MW-390: methylated melamine

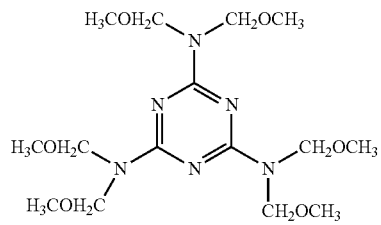

EXA-850CRP (by DIC Corp.)

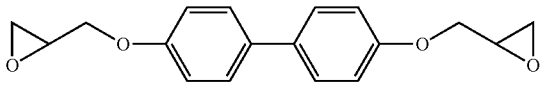

Tg of modified resins was measured by a differential scanning calorimeter by Mettler-Toledo International Inc.

TABLE 2

| | Example | | | | | | | | |
|---|---|---|---|---|---|---|---|---|---|
| | 1 | 2 | 3 | 4 | 5 | 6 | 7 | 8 | 9 |
| Tg (° C.) | 130 | 100 | 130 | 105 | 125 | 138 | 125 | 135 | 93 |

Comparative Examples are reported in Table 3.

TABLE 3

| | Comparative Example | | | | |
|---|---|---|---|---|---|
| | 1 | 2 | 3 | 4 | 5 |
| Novolak phenolic resin | Mw: 3,000 (100 g) | Mw: 7,000 (100 g) | Mw: 3,000 (100 g) | Mw: 7,000 (100 g) | Mw: 1,300 (100 g) |
| Organic solvent | cyclopentyl methyl ether (150 g) | tetrahydrofuran (500 g) | tetrahydrofuran (300 g) | propylene glycol (200 g) | tetrahydrofuran (200 g) |
| Crosslinker | — | Nikalac MW-390 (10 g) | Nikalac MX-270 (30 g) | — | Nikalac MW-390 (10 g) |
| Acidic catalyst | p-toluenesulfonic acid (10 g) | — | — | hydrochloric acid (5 g) | methanesulfonic acid (5 g) |
| Reaction conditions | 40° C./4 hr maturing after dropwise addition | 40° C./4 hr maturing after dropwise addition | 60° C./4 hr maturing during and after dropwise addition | 25° C./4 hr maturing | 40° C./4 hr maturing after dropwise addition |
| Final Mw | 3,000 | 7,000 | 3,000 | 7,000 | 1,500 |

The cresol novolak type phenolic resin used in Comparative Example 5 was a resin (Tg 50° C.) using a phenol reactant consisting of 40 wt % of p-cresol and 60 wt % of m-cresol. After the completion of reaction, the resin had Tg of 55° C.

By adding 2.76 g of pyridine to the resin solution of Example 1 and vacuum drying, 290 g of a solid was recovered, which was used in the following Application Example.

Application Example 1

A resist solution was prepared by dissolving 50 g of the solid, 3 g of crosslinker CL-1 (above), 0.3 g of photoacid generator PAG-1 having formula (3), and 0.1 g of surfactant X-70-093 (Shin-Etsu Chemical Co., Ltd.) in 100 g of propylene glycol monomethyl ether acetate (PGMEA), and filtering through a membrane filter with a pore size of 0.2 μm.

PAG-1

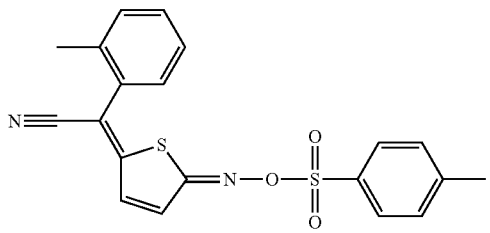

(3)

The resist solution was applied onto a silicon wafer by spin coating and prebaked on a hot plate at 100° C. for 120 seconds, forming a resist film of 6 μm thick.

The resist film was exposed to i-line through a mask by means of a mask aligner MA-8 (SUSS MicroTec AG), baked (PEB) on a hot plate at 100° C. for 120 seconds, and developed in a developer, i.e., a 2.38 wt % TMAH aqueous solution for 200 seconds. This was followed by deionized water rinsing for 30 seconds and spin drying. The resulting substrate was observed under a field emission scanning electron microscope S-4700 (Hitachi Hitechnologies Ltd.). The substrate was found to bear an iterating 10-μm line-and-space pattern, with no problems detected. Before and after development, the thickness of the resist film was measured at five points (n=5) by an optical interferometry film thickness meter, finding a film thickness loss of less than 20 nm at all points.

Notably, a resist film is regarded as experiencing a film thickness loss when the film thickness after development is less than 90% of the resist film thickness after coating and prebake.

Next, with stirring, 95 g of the solid obtained by vacuum drying the resin solution of Example 1 and 7.1 g of 1,2-naphthoquinone-2-diazido-5-sulfonyl chloride were dissolved in 300 g of 1,4-dioxane. To the solution at room temperature, 2.8 g of triethylamine was added dropwise. At the end of addition, stirring was continued for one hour. The reaction solution was poured into a large volume of 0.1N hydrochloric acid aqueous solution, whereupon a precipitated resin was recovered. The resin was vacuum dried, obtaining 100 g of the intended photosensitive resin, a partially 1,2-naphthoquinone-2-diazido-5-sulfonylated modified novolak phenolic resin. Next, a resist solution was prepared by dissolving 100 g of the partially 1,2-naphthoquinone-2-diazido-5-sulfonylated modified novolak phenolic resin and 0.1 g of surfactant X-70-093 in 200 g of PGMEA and filtering through a membrane filter with a pore size of 0.2 μm. The resist solution was applied onto a silicon wafer by spin coating and prebaked on a hot plate at 100° C. for 120 seconds, forming a resist film of 6 μm thick. The resist film was exposed by means of mask aligner MA-8 (SUSS MicroTec AG), and developed in a 2.38 wt % TMAH aqueous solution for 200 seconds. This was followed by deionized water rinsing for 30 seconds and spin drying. The resulting substrate was observed under SEM S-4700. The substrate was found to bear an iterating 10-μm line-and-space pattern, with no problems detected. The substrate was further heated at 120° C. for 5 minutes. The iterating 10-μm line-and-space pattern as heated was observed under an electron microscope, finding no changes of shape and size before and after heating.

In a further run, a resist solution was prepared by dissolving 50 g of the solid obtained by vacuum drying the resin solution of Example 1, 15 g of photoacid generator PAC-1 having formula (4) and 0.1 g of surfactant X-70-093 in 100 g of PGMEA and filtering through a membrane filter with a pore size of 0.2 μm. The resist solution was applied onto a silicon wafer by spin coating and prebaked on a hot plate at 100° C. for 120 seconds, forming a resist film of 6 μm thick. The resist film was exposed by means of mask aligner MA-8 (SUSS MicroTec AG) and developed in a 2.38 wt % TMAH aqueous solution for 200 seconds. This was followed by deionized water rinsing for 30 seconds and spin drying. The resulting substrate was observed under SEM S-4700. The substrate was found to bear an iterating 10-μm line-and-space pattern, with no problems detected.

PAC-1

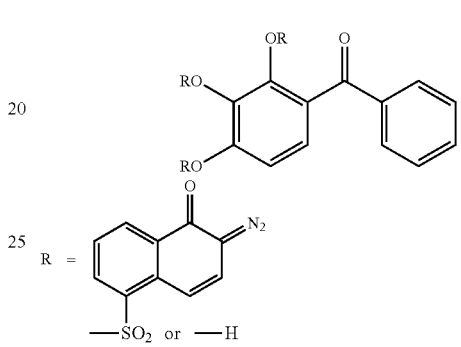

(4)

A solution was prepared by dissolving 100 g of the solid obtained by vacuum drying the resin solution of Example 1 and 2 g of methanesulfonic acid in a mixture of 200 g of cyclopentyl methyl ether and 200 g of tetrahydrofuran. The solution was cooled at 3° C. in an ice bath whereupon 20 g of ethyl vinyl ether was added dropwise. At the end of addition, 6.3 g of triethylamine was added to the solution which was kept in the ice bath for 10 minutes. With the ice bath removed at this point, the solution warmed up to 25° C. after 90 minutes. The solution was repeatedly washed with 0.1 wt % acetic acid aqueous solution until pH<4. On subsequent vacuum drying, 116 g of a solid was recovered.

A resist solution was prepared by dissolving 100 g of the thus obtained resin, 1.5 g of photoacid generator PAG-1, 0.1 g of triethanolamine and 0.1 g of surfactant X-70-093 in 200 g of PGMEA and filtering through a membrane filter with a pore size of 0.2 μm. The resist solution was applied onto a silicon wafer by spin coating and prebaked on a hot plate at 120° C. for 120 seconds, forming a resist film of 6 μm thick. The resist film was exposed to i-line by means of mask aligner MA-8 (SUSS MicroTec AG), baked (PEB) on a hot plate at 100° C. for 120 seconds, and developed in a 2.38 wt % TMAH aqueous solution for 200 seconds. This was followed by deionized water rinsing for 30 seconds and spin drying. The resulting substrate was observed under SEM S-4700. The substrate was found to bear an iterating 10-μm line-and-space pattern, with no problems detected.

In a further run, with stirring, 95 g of the solid obtained by vacuum drying the resin solution of Comparative Example 2 and 7.1 g of 1,2-naphthoquinone-2-diazido-5-sulfonyl chloride were dissolved in 300 g of 1,4-dioxane. To the solution at room temperature, 2.8 g of triethylamine was added dropwise. At the end of addition, stirring was continued for one hour. The reaction solution was poured into a large volume of 0.1N hydrochloric acid aqueous solution, whereupon a precipitated resin was recovered. The resin was vacuum dried, obtaining 100 g of the intended photosensitive resin, a partially 1,2-naphthoquinone-2-diazido-5-sulfonylated modified novolak phenolic resin. Next, a resist solution was prepared by dissolving 100 g of the partially 1,2-naphthoquinone-2-diazido-5-sulfonylated modified novolak phenolic resin and 0.1 g of surfactant X-70-093 in 200 g of PGMEA and filtering through a membrane filter with a pore size of 0.2 μm. The resist solution was applied onto a silicon wafer by spin coating and prebaked on a hot plate at 100° C. for 120 seconds, forming a resist film of 6 μm thick. The resist film was exposed to i-line by means of mask aligner MA-8 (SUSS MicroTec AG), and developed in a 2.38 wt % TMAH aqueous solution for 200 seconds. This was followed by deionized water rinsing for 30 seconds and spin drying. The resulting substrate was observed under SEM S-4700. The substrate was found to bear an iterating 10-μm line-and-space pattern, with no problems detected. The substrate was further heated at 120° C. for 5 minutes. The iterating 10-μm line-and-space pattern as heated was observed under an electron microscope, finding that the pattern profile as heated was less rectangular and the width of lines was increased near the substrate. It was demonstrated that the pattern deformed by thermal flow since the resin had low heat resistance.

In a final run, with stirring, 95 g of the solid obtained by vacuum drying the resin solution of Comparative Example 5 and 10.1 g of 1,2-naphthoquinone-2-diazido-5-sulfonyl chloride were dissolved in 300 g of 1,4-dioxane. To the solution at room temperature, 2.8 g of triethylamine was added dropwise. At the end of addition, stirring was continued for one hour. The reaction solution was poured into a large volume of 0.1N hydrochloric acid aqueous solution, whereupon a precipitated resin was recovered. The resin was vacuum dried, obtaining 100 g of the intended photosensitive resin, a partially 1,2-naphthoquinone-2-diazido-5-sulfonylated modified novolak phenolic resin. Next, a resist solution was prepared by dissolving 100 g of the partially 1,2-naphthoquinone-2-diazido-5-sulfonylated modified novolak phenolic resin and 0.1 g of surfactant X-70-093 in 200 g of PGMEA and filtering through a membrane filter with a pore size of 0.2 μm. The resist solution was applied onto a silicon wafer by spin coating and prebaked on a hot plate at 100° C. for 120 seconds, forming a resist film of 6 μm thick. The resist film was exposed to i-line by means of mask aligner MA-8 (SUSS MicroTec AG), and developed in a 2.38 wt % TMAH aqueous solution for 200 seconds. This was followed by deionized water rinsing for 30 seconds and spin drying. The thickness of the film after development was measured to be 68% of the thickness of the prebaked film, which was practically unacceptable.

Japanese Patent Application Nos. 2011-233901 and 2012-176987 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a solvent, a 1,2-naphthoquinonediazidosulfonic acid ester and as a base resin a modified novolak phenolic resin obtained by reacting (A) a novolak phenolic resin obtained from condensation of a phenol containing at least 50% by weight of p-cresol and an aldehyde, or (B) a mixture of (b-1) at least 50% by weight of a p-cresol novolak resin obtained from condensation of p-cresol and an aldehyde and (b-2) the balance of another novolak phenolic resin obtained from condensation of a phenol other than p-cresol and an aldehyde with a crosslinker.

2. The resist composition of claim 1 which is a positive working composition.

3. The resist composition of claim 1 wherein the 1,2-naphthoquinonediazidosulfonic acid ester is an ester of some or all modified phenolic hydroxyl groups on the modified novolak phenolic resin of claim 1 with 1,2-naphthoquinonediazidosulfonic acid.

4. The resist composition of claim 1 wherein the phenol from which the novolak phenolic resin (A) is obtained consists of 50 to 80% by weight of p-cresol and the balance of another phenol.

5. The resist composition of claim 1 wherein the mixture (B) consists of 50 to 80% by weight of the p-cresol novolak resin (b-1) and the balance of the other novolak phenolic resin (b-2).

6. The resist composition of claim 1 wherein the novolak phenolic resin (A), the p-cresol novolak resin (b-1), and the other novolak phenolic resin (b-2) each have a weight average molecular weight in the range of 1,500 to 10,000.

7. The resist composition of claim 1 wherein the crosslinker is at least one member selected from the group consisting of an amino condensate modified with formalin or formalin-alcohol, a phenol compound having on average at least two methylol or alkoxymethylol groups in a molecule, and an epoxy compound having on average at least two epoxy groups in a molecule.

8. The resist composition of claim 7 wherein the crosslinker is a modified melamine condensate or modified urea condensate.

* * * * *